United States Patent

(12) United States Patent
Zhang

(10) Patent No.: US 12,193,266 B2
(45) Date of Patent: Jan. 7, 2025

(54) DISPLAY PANEL, METHOD FOR MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Ruqin Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 658 days.

(21) Appl. No.: 17/307,282

(22) Filed: May 4, 2021

(65) Prior Publication Data
US 2022/0020968 A1    Jan. 20, 2022

(30) Foreign Application Priority Data
Jul. 20, 2020    (CN) .......................... 202010697627.2

(51) Int. Cl.
H10K 50/86    (2023.01)
H10K 59/122   (2023.01)
H10K 59/38    (2023.01)

(52) U.S. Cl.
CPC ......... *H10K 50/865* (2023.02); *H10K 59/122* (2023.02); *H10K 59/38* (2023.02)

(58) Field of Classification Search
CPC ..... H10K 50/865; H10K 59/122; H10K 59/38
See application file for complete search history.

(56) References Cited

U.S. PATENT DOCUMENTS

2012/0168796 A1*  7/2012  Moon .................... H10K 59/38
                                                    257/E51.019
2015/0236076 A1*  8/2015  Sim ...................... H10K 59/122
                                                    438/34
2019/0189704 A1*  6/2019  Yang .................... G09G 3/3225

FOREIGN PATENT DOCUMENTS

CN           114823813 A   * 10/2019

* cited by examiner

*Primary Examiner* — Fernando L Toledo
*Assistant Examiner* — Jahae Kim
(74) *Attorney, Agent, or Firm* — BROOKS KUSHMAN P.C.

(57) ABSTRACT

A display panel includes: a back plane; at least one subpixel arranged on the back plane and including a light-emitting material layer; a pixel definition layer provided with first apertures corresponding to subpixels respectively, each subpixel being located within a corresponding first aperture; and a black matrix arranged at a side of the pixel definition layer away from the back plane and provided with second apertures corresponding to the first apertures respectively. A projection of each first aperture onto the back plane is located within a projection of a corresponding second aperture onto the back plane, a center of each second aperture is offset toward a peripheral point of the light-emitting material layer closest to the black matrix relative to a center of the corresponding first aperture, and the light-emitting material layer is in an inclined state relative to the pixel definition layer.

17 Claims, 10 Drawing Sheets

DISPLAY PANEL, METHOD FOR MANUFACTURING THE SAME AND DISPLAY DEVICE

CROSS-REFERENCE TO RELATED APPLICATION

This application claims priority to Chinese Patent Application No. 202010697627.2 filed on Jul. 20, 2020, which is incorporated herein by reference in its entirety.

TECHNICAL FIELD

The present disclosure generally relates the field of display technology, in particular to a display panel, a method for manufacturing the display panel and a display device.

BACKGROUND

Active Matrix Organic Light-Emitting Diode (AMOLED) is one of the most promising display technologies due to such advantages as self-luminescence, simple structure, wide viewing angle, low power consumption and being capable of achieving flexible display. For an OLED display technology, it is an inevitable trend to reduce the power consumption and prolong a service life, and Color Filter on Encapsulation (COE) is a very efficient measure to reduce the power consumption and prolong the service life at the same time.

SUMMARY

In a first aspect, the present disclosure provides in some embodiments a display panel, including: a back plane; at least one subpixel arranged on the back plane and including a light-emitting material layer; a pixel definition layer provided with first apertures corresponding to subpixels respectively, each subpixel being located within a corresponding first aperture; and a black matrix arranged at a side of the pixel definition layer away from the back plane and provided with second apertures corresponding to the first apertures respectively. A projection of each first aperture onto the back plane is located within a projection of a corresponding second aperture onto the back plane, a center of each second aperture is offset toward a peripheral point of the light-emitting material layer closest to the black matrix relative to a center of the corresponding first aperture, and the light-emitting material layer is in an inclined state relative to the pixel definition layer.

In a second aspect, the present disclosure provides in some embodiments a method for manufacturing the above-mentioned display panel, including: forming a black matrix material layer at a side of the display panel away from a back plane, the display panel including the back plane, at least one subpixel arranged on the back plane and including a light-emitting material layer, and a pixel definition layer provided with first apertures corresponding to the subpixels respectively, each subpixel being located within a corresponding first aperture; determining patterns of second apertures in the black matrix material layer; etching the black matrix material layer in accordance with the patterns of the second apertures so as to form the second apertures corresponding to the first apertures respectively, a projection of each first aperture onto the back plane being located within a projection of a corresponding second aperture onto the back plane, a center of each second aperture being offset toward a peripheral point of the light-emitting material layer closest to the black matrix relative to a center of the corresponding first aperture, and the light-emitting material layer being in an inclined state relative to the pixel definition layer; and forming a subpixel color film within each second aperture to form a color film layer.

In a third aspect, the present disclosure provides in some embodiments a display device including the above-mentioned display panel.

BRIEF DESCRIPTION OF THE DRAWINGS

The other features, advantages and advantages will become more apparent through reading the detailed description hereinafter given with reference to the following drawings.

DETAILED DESCRIPTION

Figure 1:
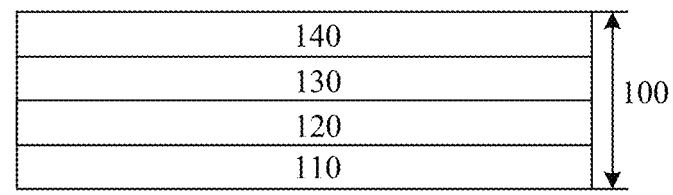
FIG. 1 is a schematic view showing a display panel.

The present disclosure will be described hereinafter in conjunction with the drawings and embodiments. The following embodiments are for illustrative purposes only, but shall not be used to limit the scope of the present disclosure. It should be appreciated that, for ease of description, merely members related to the present disclosure are shown in the drawings.

It should be appreciated that, the embodiments of the present disclosure and the features therein may be combined in any form in the case of no conflict. The present disclosure will be described hereinafter in conjunction with the embodiments and the drawings.

For an OLED display technology, it is an inevitable trend to reduce the power consumption and prolong a service life, and COE is a very efficient measure to reduce the power consumption and prolong the service life at the same time. In a COE-based OLED display device, a conventional polarizer is replaced with a COE structure, so as to provide an upper layer of a light-emitting assembly with a higher light transmittance, thereby to reduce the power consumption of the light-emitting assembly. Meanwhile, the light-emitting assembly has a longer service life due to a low driving current. In addition, as compared with the conventional polarizer, the COE structure has a smaller thickness, so it is able to provide a foldable and rollable screen.

Usually, a display panel includes a back plane, a display functional layer, an encapsulation layer and a color film layer laminated one on another. The color film layer usually includes Black Matrices (BMs) and subpixel color films in red, green and blue arranged alternately. Projections of the subpixel color films onto the back plane coincide with projections of light-emitting material layers for red, green and blue subpixels formed in the display function layer onto the back plane, so as to enable the display panel to provide different colors.

However, due to some inevitable design requirements on a structure of the back plane or process defects, color deviation may occur for the display panel when displaying an image.

FIG. 1 shows a sectional view of a display region of a display panel 100. As shown in FIG. 1, the display panel 100 includes a Back Plane (BP) 110, a display functional layer 120, a thin film encapsulation layer 130 and a color film layer 140.

In the related art, the film layers of the display panel are arranged horizontally, and light emitted by light-emitting material layers of subpixels in the display functional layer may reach color film layers uniformly. The light may pass through subpixel color films in the color film layers to display an image.

Figure 2:
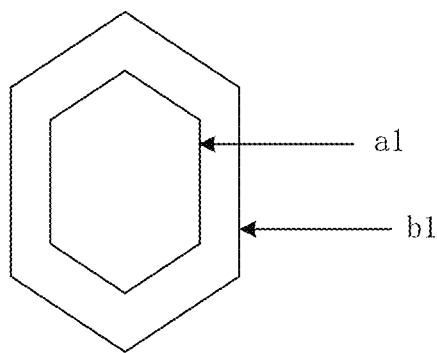
FIG. 2 is a top view of a light-emitting region of a conventional display panel.

A pixel definition layer in the display functional layer may be provided with first apertures, and each light-emitting material layer may be arranged in a corresponding first aperture. Each black matrix in the color film layer may be provided with a second aperture, and a subpixel color film may be arranged in the second aperture. FIG. 2 shows projections of the second aperture and the first aperture corresponding to a certain light-emitting material layer onto the back plane. As shown in FIG. 2, a projection a1 of the first aperture onto the back plane is located within a projection b1 of the second aperture onto the back plane, and the projections a1 and b1 are different patterns of a same shape and with their centers coinciding with each other.

Figure 3:
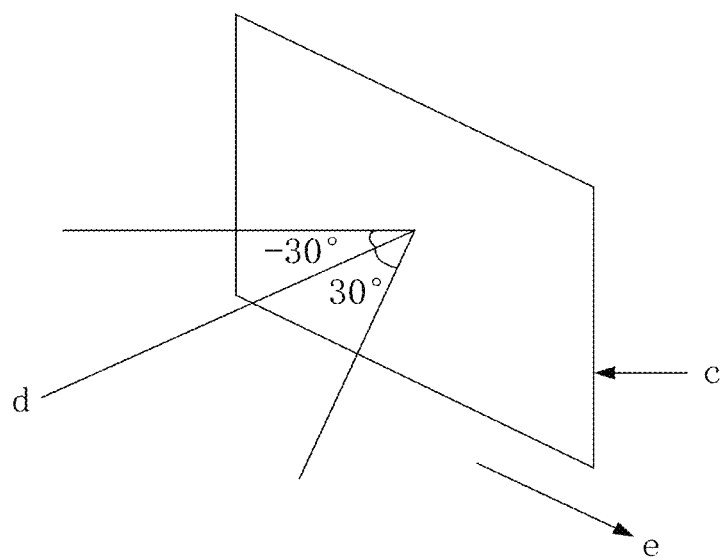
FIG. 3 is a schematic view showing viewing angles for the display panel according to one embodiment of the present disclosure.

Through the first aperture and the second aperture having different areas but with the centers of their projections onto the back plane coinciding with each other, because the light emitted by the light-emitting material layers of subpixels in three colors reaches each subpixel color film uniformly, the light may exhibit a same light attenuation level in the case of positive and negative viewing angles with a same absolute value, and usually the color deviation may not occur for the image displayed by the display panel. FIG. 3 shows a display screen C, where d represents a normal of the display scene, a viewing angle in a direction e is a positive viewing angle, and a viewing angle in a direction opposite to the direction e is a negative viewing angle. FIG. 3 shows a viewing angle of +30° and a viewing angle of −30°.

Figure 4:
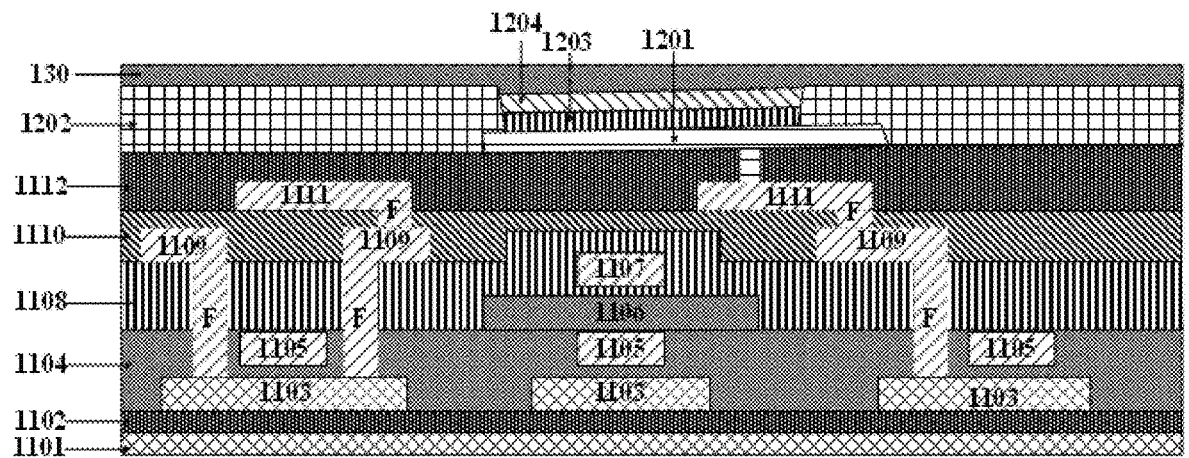
FIG. 4 is a schematic view showing the display panel according to one embodiment of the present disclosure.

However, when the display panel has two source-drain electrode layers, as shown in FIG. 4, the display panel without any black matrix includes a back plane, a display functional layer and a thin film encapsulation layer 130 laminated one on another. The back plane includes a base substrate 1101, a buffer layer 1102, a silicon-based substrate 1103, a first gate insulation layer 1104, a first gate electrode layer 1105, a second gate insulation layer 1106, a second gate electrode layer 1107, an interlayer dielectric layer 1108, a first source-drain electrode layer 1109, a first planarization layer 1110, a second source-drain electrode layer 1111 and a second planarization layer 1112. The first source-drain electrode layer 1109 is connected to the silicon-based substrate 1103 through a via-hole F, and the second source-drain electrode layer 1111 is connected to the first source-drain electrode layer 1109 through the via-hole F. The display functional layer includes at least one subpixel arranged on the back plane. Each subpixel includes a first electrode 1201, a light-emitting material layer 1203 and a second electrode 1204 laminated one on another. The first electrodes 1201 are spaced apart from each other to form a first electrode layer. The display functional layer further includes a pixel definition layer 1202 provided with first apertures corresponding to the subpixels respectively, and each subpixel is arranged within the corresponding first aperture. The first electrode 1201 is connected to the second source-drain electrode layer 1111 through the via-hole F. In an energized state, the light-emitting material layer may emit light in red, green or blue. Because the second source-drain electrode layer 1111 is arranged under the light-emitting material layer 1203, the first electrode 1201 and the light-emitting material layer 1203 may each be in an inclined state. The first electrode layer is an anode layer and a second electrode layer is a cathode layer, or the first electrode layer is a cathode layer and the second electrode layer is an anode layer.

Figure 5:
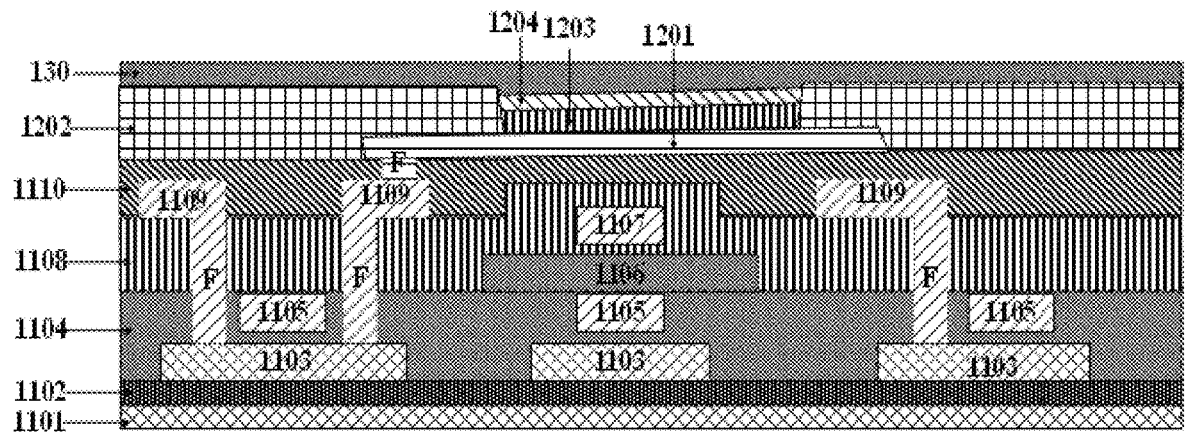
FIG. 5 is another schematic view showing the display panel according to one embodiment of the present disclosure.

For another example, as shown in FIG. 5, the display panel without any black matrix includes a back plane, a display function layer and a thin film encapsulation layer 130 laminated one on another. The back plane includes a base substrate 1101, a buffer layer 1102, a silicon-based substrate 1103, a first gate insulation layer 1104, a first gate electrode layer 1105, a second gate insulation layer 1106, a second gate electrode layer 1107, an interlayer dielectric layer 1108, a source-drain electrode layer 1109 and a planarization layer 1110. The source-drain electrode layer 1109 is connected to the silicon-based substrate 1103 through a via-hole F. A structure of the display functional layer 120 is the same as that in FIG. 4. In order to ensure the connection between the first electrode 1201 and the source-drain electrode layer 1109, it is necessary to form the via-hole F in the planarization layer 1110 between the first electrode 1201 and the source-drain electrode layer 1109. At this time, the polarization layer 1110 may collapse at a position corresponding to the via-hole, and thereby the planarization layer 1110 may be in an inclined state. When the first electrode 1201 and the light-emitting material layer 1202 are formed subsequently at a position where the planarization layer 1110 is in the inclined state, the light-emitting material layer 1202 in the resultant display panel may also be in the inclined state.

In the display panel with the light-emitting material layer in the inclined state as shown in FIGS. 4 and 5, when apertures for the black matrices are formed in the thin film encapsulation layer of the display panel as shown in FIG. 2, the light emitted by the light-emitting material layers of the subpixels in different colors may reach the subpixel color films in the second apertures non-uniformly. At this time, the light may exhibit different light attenuation levels in the case of the positive and negative viewing angles with a same absolute value, and thereby the color deviation may occur for the image displayed by the display panel.

Figure 6:
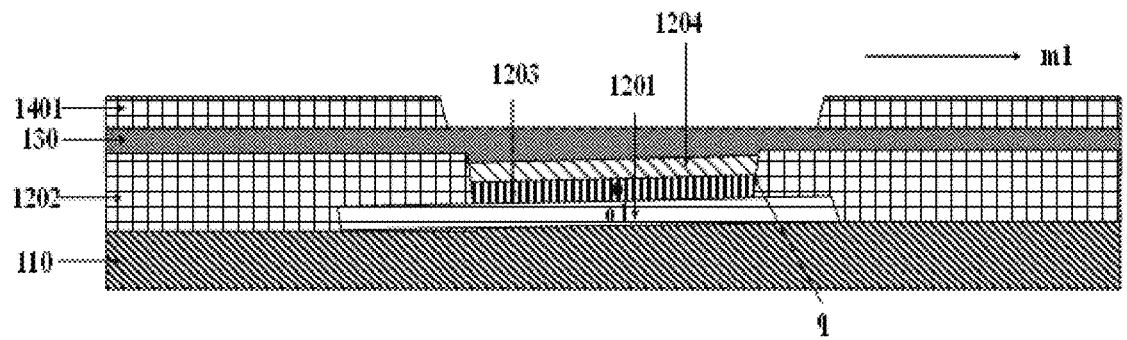
FIG. 6 is a schematic view showing the display panel according to one embodiment of the present disclosure.

The present disclosure provides in some embodiments a display panel, so as to prevent the occurrence of the color deviation for the display panel caused by the light-emitting material in the inclined state. FIG. 6 is a partially sectional view of the display panel. As shown in FIG. 6, the display panel includes a back plane 110, at least one subpixel arranged on the back plane and including a light-emitting material layer 1203, and a pixel definition layer 1202 provided with first apertures corresponding to the subpixels respectively. Each subpixel is arranged within a corresponding first aperture.

FIG. 6 merely shows one subpixel, and the light-emitting material layer 1203 of the subpixel is inclined relative to a first direction m1 of the pixel definition layer. A peripheral point q of the light-emitting material layer 1203 closest to a black matrix is located at a side of a center o1 of the first aperture a1 in the first direction m1. A structure of the back plane 110 may refer to that in FIG. 4 or 5, and thus will not be particularly defined herein.

It should be appreciated that, when the light-emitting material layer of the subpixel is inclined relative to the first direction of the pixel definition layer, it means that the peripheral point of the light-emitting material layer closest to the black matrix is located at the side of the center of the first aperture in the first direction. Similarly, when the light-emitting material layer of the subpixel is inclined relative to a second direction of the pixel definition layer described hereinafter, it means that the peripheral point of the light-emitting material layer closest to the black matrix is located at a side of the center of the first aperture in the second direction.

Figure 7:
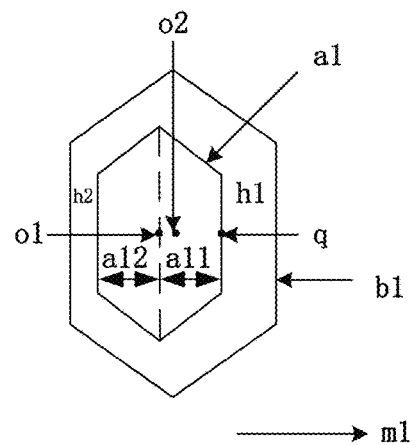
FIG. 7 is a schematic view showing a light-emitting region of the display panel according to one embodiment of the present disclosure.

The display panel may further include a black matrix 1401 arranged at a side of the pixel definition layer 1202 away from the back plane 110 and provided with second apertures corresponding to the first apertures respectively. As shown in FIG. 7, a projection a1 of each first aperture onto the back plane may be located within a projection b1 of the corresponding second aperture onto the back plane, and a center o2 of the second aperture may be offset toward the peripheral point q of the light-emitting material layer closest to the black matrix relative to the center o1 of the first aperture.

In some embodiments of the present disclosure, the projection of the first aperture onto the back plane may be an orthogonal projection of the first aperture onto the back plane, and the projection of the second aperture onto the back plane may be an orthogonal projection of the second aperture onto the back plane.

When there is a plurality of peripheral points q of the light-emitting material layer closest to the black matrix, a peripheral point in the plurality of peripheral points q close to a middle position may be determined as the peripheral point q of the light-emitting material layer closest to the black matrix. For example, the peripheral point in the plurality of peripheral points q close to the middle position may be a peripheral point in the plurality of peripheral points q close to the middle position in a direction perpendicular to paper in FIG. 6.

When an inclination angle of the light-emitting material layer increases, a distance of the center of the second aperture offset toward the peripheral point of the light-emitting material layer closest to the black matrix relative to the center of the first aperture may increase too. The center may be a center of gravity of a pattern of the first aperture or second aperture. It should be appreciated that, when each of the first aperture and the second aperture is a regular pattern, the center may be a geometrical center of the pattern of the first aperture or second aperture. The first aperture may be similar to the second aperture.

In a possible embodiment of the present disclosure, in order to prevent the display panel from being oxidized or damaged, as shown in FIG. 6, a thin film encapsulation layer 130 may be further arranged between the black matrix 1401 and the pixel definition layer 1202.

In a possible embodiment of the present disclosure, a first distance between a projection of the peripheral point of the light-emitting material layer closest to the black matrix onto the back plane and an edge of the projection of the second aperture onto the back plane in a direction of the pixel definition layer that the light-emitting material layer is inclined relative to may be 3 μm to 5 μm, and a second distance between a projection of a peripheral point of the light-emitting material layer furthest from the black matrix onto the back plane and the edge of the projection of the second aperture onto the back plane in a direction opposite to the direction of the pixel definition layer that the light-emitting material layer is inclined relative to may be 1 μm to 2 μm. It should be appreciated that, the direction of the pixel definition layer that the light-emitting material layer is inclined relative to may be the first direction m1, or a direction opposite to the first direction m1. In other words, the light-emitting material layer may be inclined relative to the first direction m1 of the pixel definition layer, or the direction opposite to the first direction m1 of the pixel definition layer.

A distance of the center of the second aperture offset toward the peripheral point of the light-emitting material layer closest to the black matrix relative to the center of the first aperture may be 0.5 μm to 2 μm. In addition, when there is a plurality of peripheral points of the light-emitting material layer furthest from the black matrix, a peripheral point in the plurality of peripheral points close to a middle position may be determined as the peripheral point of the light-emitting material layer furthest from the black matrix. For example, the peripheral point in the plurality of peripheral points close to the middle position may be a peripheral point in the plurality of peripheral points close to the middle position in the direction perpendicular to paper in FIG. 6.

It should be appreciated that, in the embodiments of the present disclosure, an aperture region of the first aperture between a center line of the first aperture passing through the center of the first aperture and a peripheral line passing through the peripheral point of the light-emitting material layer closest to the black matrix may be determined as a first sub-aperture, and a remaining region of the first aperture may be determined as a second sub-aperture. The center line and the peripheral line may each be perpendicular to the back plane, and the center line may be parallel to the peripheral line. In some embodiments of the present disclosure, a distance between an edge of a projection of the first sub-aperture onto the back plane and the edge of the projection of the second aperture onto the back plane in the first direction may be greater than a distance between an edge of a projection of the second sub-aperture onto the back plane and the edge of the projection of the second aperture onto the back plane in the second direction (opposite to the first direction). At this time, the direction of the pixel definition layer that the light-emitting material layer is inclined relative to is the first direction.

Referring to FIG. 6 again, the peripheral point q of the light-emitting material layer closest to the black matrix may be arranged at a side of the center o1 of the first aperture in the first direction ml. At this time, a region at a side of the center line passing through the center o1 of the first aperture in the first direction ml may be the first sub-aperture, and a region at a side of the center line passing through the center o1 of the first aperture in a direction opposite to the first direction ml may be the second sub-aperture. As shown in FIG. 7, a distance h1 between an edge of a projection a11 of the first sub-aperture onto the back plane and an edge of the projection b1 of the second aperture onto the back plane in the first direction (that is because the light-emitting material layer is inclined relative to the first direction of the pixel definition layer) may be greater than a distance h2 between an edge of a projection a12 of the second sub-aperture onto the back plane and the edge of the projection b1 of the second aperture onto the back plane in the second direction (opposite to the first direction).

A subpixel color film in a same color as a subpixel corresponding to the second aperture may be arranged in the second aperture, so as to display an image. A film layer where the black matrix and the subpixel color film are located may be the color film layer. Depending on an inclined state of the light-emitting material layer, a shape of the second aperture may be set in such a manner that the light emitted by the light-emitting material layer exhibits a same light attenuation level in the case of the positive and negative viewing angles with a same absolute value after the light has reached the subpixel color film, so as to prevent the occurrence of the color deviation for the display panel.

In a possible embodiment of the present disclosure, when the at least one subpixel includes subpixels of a first type and subpixels of a second type, a first light-emitting material layer of each subpixel of the first type may be inclined relative to the first direction of the pixel definition layer, and a second light-emitting material layer of each subpixel of the second type may be inclined relative to a second direction of the pixel definition.

In some embodiments of the present disclosure, the at least one subpixel may further include subpixels of a third type, and a third light-emitting material layer of each subpixel of the third type may be parallel to the pixel definition layer.

Because the third light-emitting material layer is not inclined relative to the pixel definition layer, a pattern of the second aperture corresponding to the third light-emitting material layer may be that known in the art.

The first light-emitting material layer and the second light-emitting material layer may be in various inclined states. The subpixel of the first type may include any one of a blue subpixel, a red subpixel and a green subpixel, and the subpixel of the second type may include any one of a blue subpixel, a red subpixel and a green subpixel. The structure of the display panel will be described hereinafter when the light-emitting material layers are in two inclined states.

Figure 8:
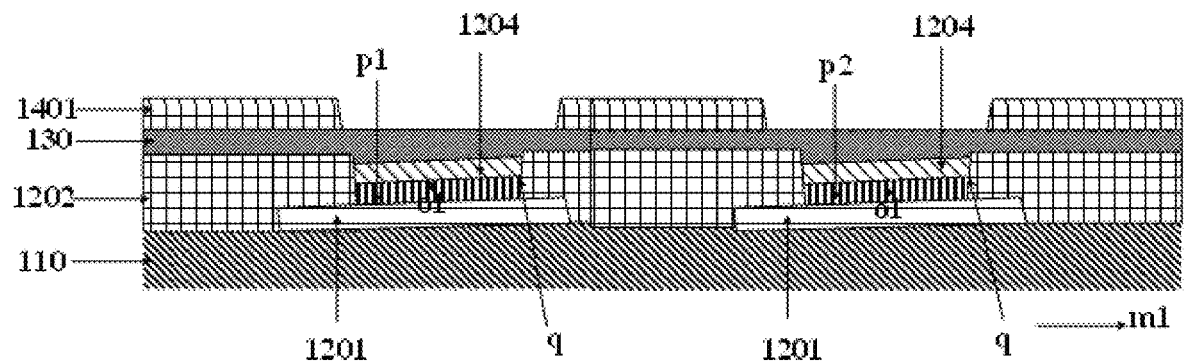
FIG. 8 is another schematic view showing the display panel according to one embodiment of the present disclosure.

In a possible embodiment of the present disclosure, the first direction may be the same as the second direction. In the display panel, FIG. 8 shows inclined states of the first light-emitting material layer P1 and the second light-emitting material layer P2. The peripheral point q of each of the first light-emitting material layer P1 and the second light-emitting material layer P2 closest to the black matrix may be at a side of the center o1 of the first aperture corresponding to each light-emitting material layer in the first direction ml. The first direction may be a direction relative to the pixel definition layer. For example, the subpixel of the first type may be a blue subpixel, and the subpixel of the second type may be a red subpixel.

Figure 9:
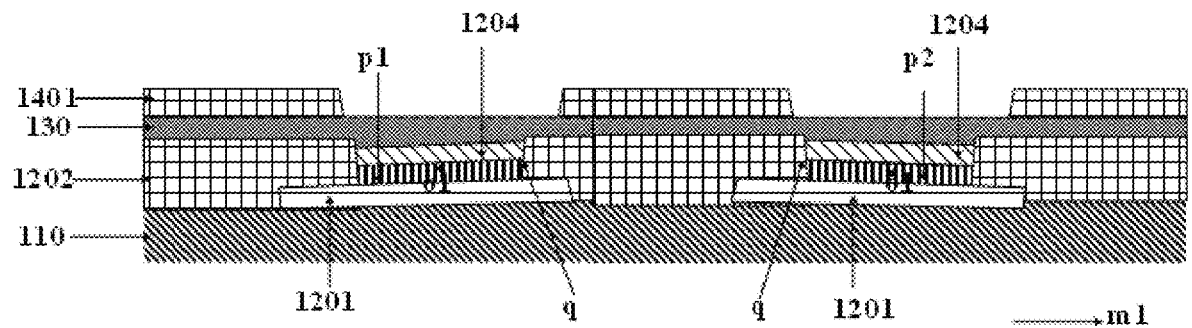
FIG. 9 is yet another schematic view showing the display panel according to one embodiment of the present disclosure.

In another possible embodiment of the present disclosure, the first direction may be opposite to the second direction. In the display panel, FIG. 9 shows inclined states of the first light-emitting material layer P1 and the second light-emitting material layer P2. The peripheral point q of the first light-emitting material layer P1 closest to the black matrix may be at a side of the center o1 of the first aperture corresponding to the first light-emitting material layer in the first direction ml, and a peripheral point q of the second light-emitting material layer P2 closest to the black matrix may be at a side of the center o1 of the first aperture corresponding to the second light-emitting material in a direction opposite to the first direction. For example, the subpixel of the first type may be a blue subpixel and the subpixel of the second type may be a green subpixel, or the subpixel of the first type may be a red subpixel and the subpixel of the second type may be a green subpixel.

In a possible embodiment of the present disclosure, the display panel may further include a protection layer arranged at a side of the black matrix away from the back plane, so as to prevent oxygen and moisture from entering the display panel, and prevent the display panel from being damaged due to an internal or external force.

In a possible embodiment of the present disclosure, in the display panel, the subpixels of the first type may include a blue subpixel and a red subpixel, and the subpixel of the second type may include a green subpixel.

Figure 10A:
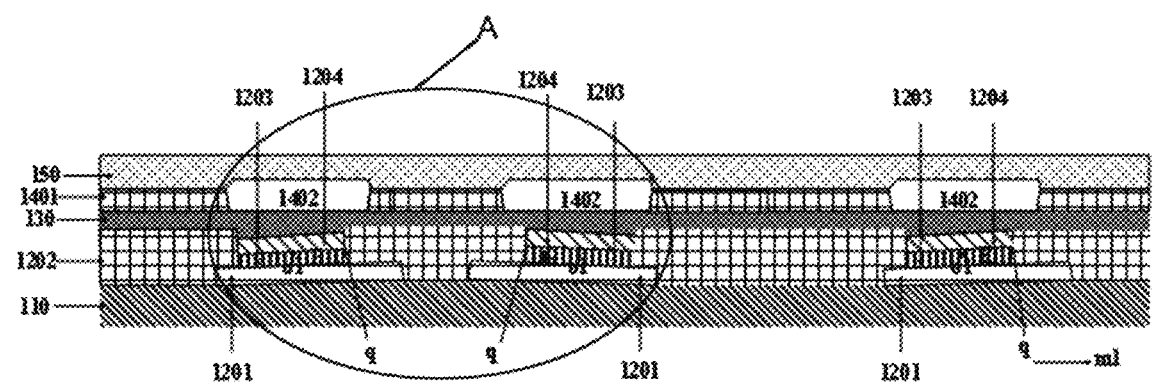
FIG. 10A is still yet another schematic view showing the display panel and FIG. 10B is an enlarged schematic diagram of A in FIG. 10A according to one embodiment of the present disclosure.
Figure 10B:
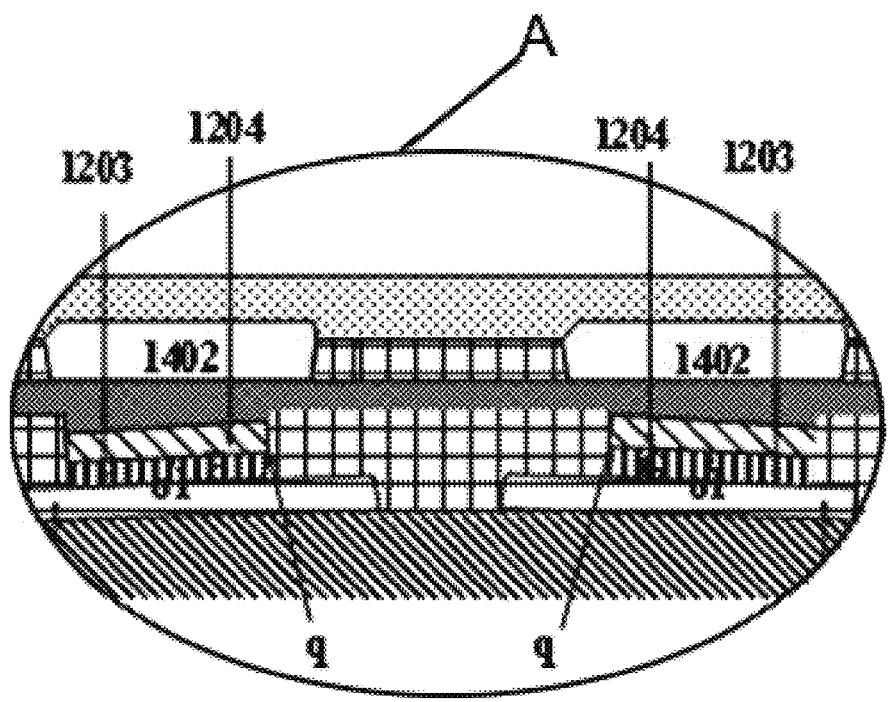

FIG. 10A is a partially sectional view of a light-emitting region of the display panel. FIG. 10B is an enlarged schematic diagram of A in FIG. 10A. For example, the display panel may further include a subpixel color film 1402 and a protection layer 150. A light-emitting material layer corresponding to the blue subpixel and a light-emitting material layer corresponding to the red subpixel may be inclined relative to the first direction ml of the pixel definition layer, a light-emitting material layer corresponding to the green subpixel may be inclined relative to the second direction of the pixel definition layer, and the first direction may be opposite to the second direction.

Figure 11:
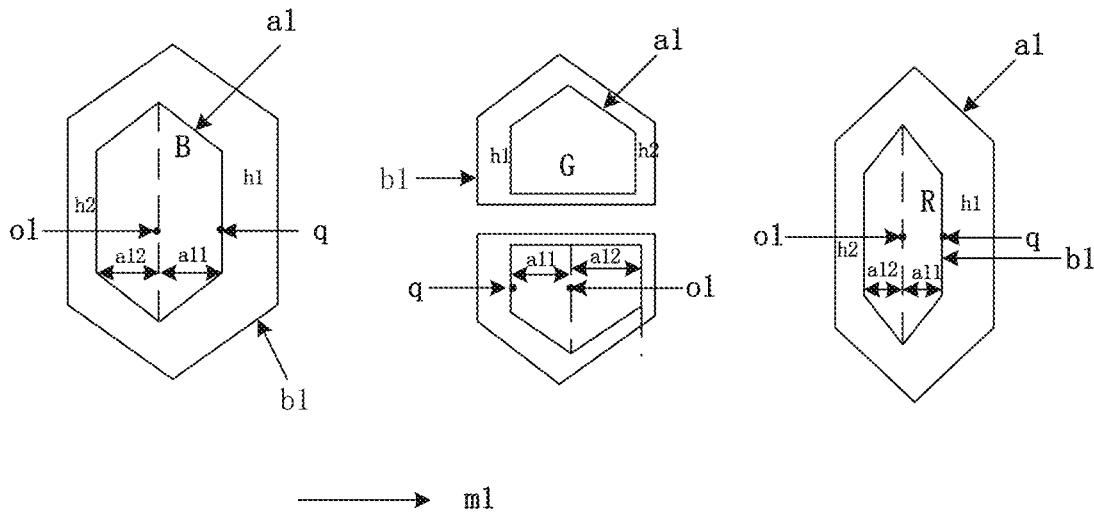
FIG. 11 is a top view of the light-emitting region of the display panel according to one embodiment of the present disclosure.

FIG. 11 is a top view of the display panel in FIG. 10A. The projection a1 of the first aperture corresponding to each light-emitting material layer onto the back plane may be located within the projection b1 of the corresponding second aperture onto the back plane, and the center o2 of the second aperture corresponding to the light-emitting material layer may be offset toward the peripheral point of the light-emitting material layer closest to the black matrix relative to the center o1 of the first aperture.

As shown in FIGS. 10A and 10B, the peripheral point q of each of the light-emitting material layer corresponding to the blue subpixel and the light-emitting material layer corresponding to the red subpixel closest to the black matrix may be arranged at a side of the center o1 of the first aperture in the first direction. At this time, a region at a side of a center line passing through the center o1 of the first aperture in the first direction may be a first sub-aperture, and a region at a side of the center line passing through the center o1 of the first aperture in a direction opposite to the first direction may be a second sub-aperture. The peripheral point 1 of the light-emitting material layer corresponding to the green subpixel closest to the black matrix may be arranged at a side of the center o1 of the first aperture in the second direction. At this time, a region at a side of the center line passing through the center o1 of the first aperture in a direction opposite to the second direction may be a second sub-aperture, and a region at a side of the center line passing through the center o1 of the first aperture in the second direction may be a first sub-aperture. A distance h1 between an edge of a projection a11 of the first sub-aperture onto the back plane and an edge of the projection b1 of the second aperture onto the back plane in the second direction (that is because the light-emitting material layer corresponding to the green subpixel is inclined relative to the second direction of the pixel definition layer) may be greater than a distance h2 between an edge of a projection a12 of the second sub-aperture onto the back plane and the edge of the projection b1 of the second aperture onto the back plane in the first direction (opposite to the second direction).

For example, when an inclination angle of the light-emitting material layer is 4°, the distance between the edge of the projection of the first sub-aperture onto the back plane and the edge of the projection of the second aperture onto the back plane in the direction of the pixel definition layer that the light-emitting material layer is inclined relative to may be 4 µm, and the distance between the edge of the projection of the second sub-aperture onto the back plane and the edge of the projection of the second aperture onto the back plane in the direction opposite to the direction of the pixel definition layer that the light-emitting material layer is inclined relative to may be 2 µm.

In the embodiments of the present disclosure, depending on the inclined state of the light-emitting material layer, a shape of the second aperture may be set in such a manner that the light emitted by the light-emitting material layer exhibits a same light attenuation level in the case of the positive and negative viewing angles with a same absolute value after the light has passed through the subpixel color film, so as to prevent the occurrence of the color deviation for the display panel.

In some embodiments of the present disclosure, the display panel may be a flexible display panel. In order to provide a touch function, a flexible touch panel may be manufactured through a Flexible Multiple Layer On Cell (F-MLOC) process. A touch layer may be arranged between the thin film encapsulation layer and the black matrix of the flexible touch panel, so as to provide the flexible touch panel with the touch function.

In a word, according to the embodiments of the present disclosure, the display panel may include: the back plane; the at least one subpixel arranged on the back plane and including the light-emitting material layer; the pixel definition layer provided with the first apertures corresponding to the subpixels respectively, each subpixel being located within the corresponding first aperture; and the black matrix arranged at a side of the pixel definition layer away from the back plane and provided with the second apertures corresponding to the first apertures respectively. The projection of the first aperture onto the back plane may be located within the projection of the second aperture onto the back plane, the center of the second aperture may be offset toward the peripheral point of the light-emitting material layer closest to the black matrix relative to the center of the first aperture, and the light-emitting material layer may be in the inclined state relative to the pixel definition. As a result, it is able for the light emitted by the light-emitting material layer to exhibit a same light attenuation level in the case of the positive and negative viewing angles with a same absolute value, thereby to prevent the occurrence of color deviation.

Figure 12:
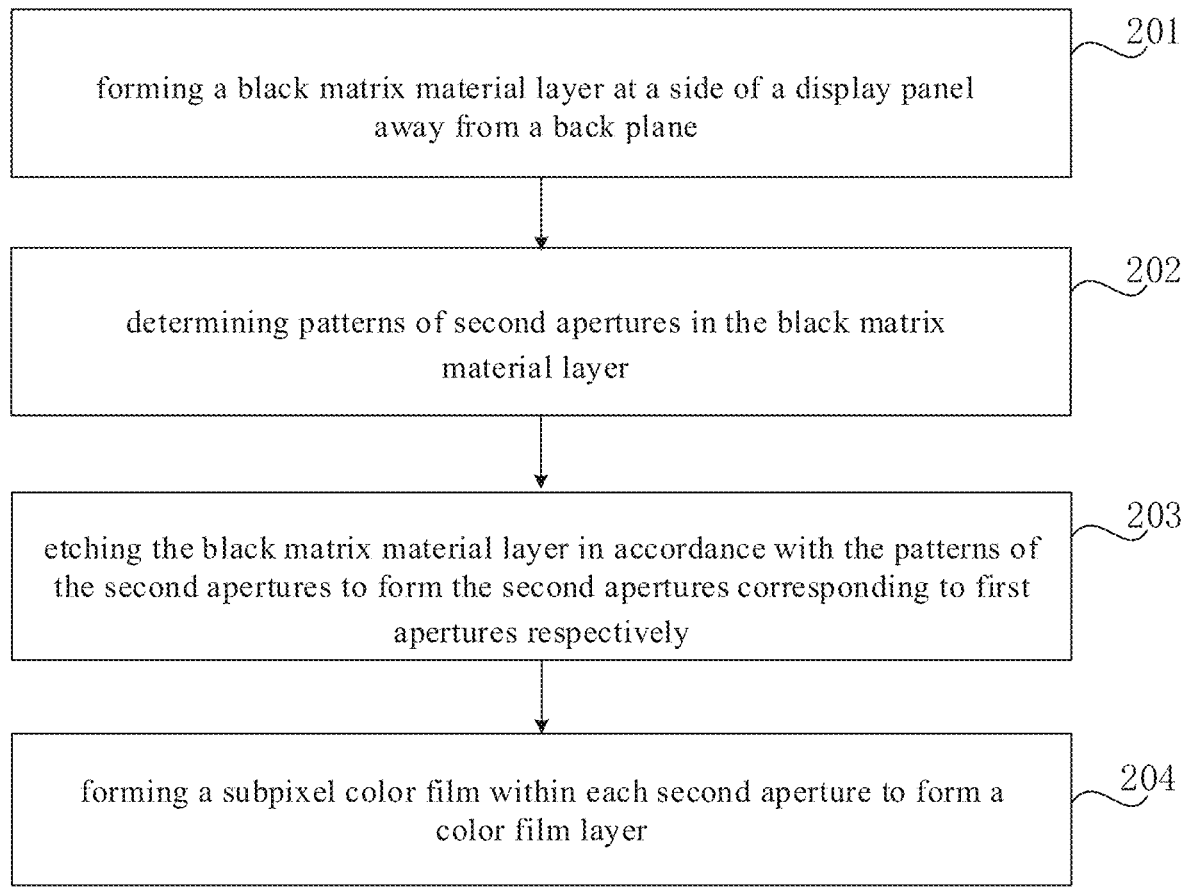
FIG. 12 is a flow chart of a method for manufacturing the display panel according to one embodiment of the present disclosure.

The present disclosure further provides in some embodiments a method for manufacturing the above-mentioned display panel which, as shown in FIG. 12, includes the following steps.

Step 201: forming a black matrix material layer at a side of the display panel away from the back plane.

In the embodiments of the present disclosure, the display panel may include: a back plane; at least one subpixel arranged on the back plane and including a light-emitting material layer; and a pixel definition layer provided with first apertures corresponding to the subpixels respectively, each subpixel being located within a corresponding first aperture.

In some embodiments of the present disclosure, in order to protect the display panel, a thin film encapsulation layer may be arranged at a side of the pixel definition layer away from the back plane. The display panel may be a display panel that has been manufactured and that has a structure as shown in FIG. 4 or 5, and the light-emitting material layer may be in an inclined state.

In this step, a nontransparent material, e.g., a resin material, may be applied onto the thin film encapsulation layer of the display panel, so as to ensure the flexibility of the display panel.

Step 202: determining patterns of the second apertures in the black matrix material layer.

Step 203: etching the black matrix material layer in accordance with the patterns of the second apertures so as to form the second apertures corresponding to the first apertures respectively.

In this step, the black matrix material layer may be etched through a patterning process so as to form the second apertures corresponding to the first apertures respectively, thereby to enable the center of each second aperture to be offset toward the peripheral point of the light-emitting material closest to the black matrix relative to the center of the first aperture. The projection of the first aperture onto the back plane may be located within the projection of the second aperture onto the back plane.

Figure 13:
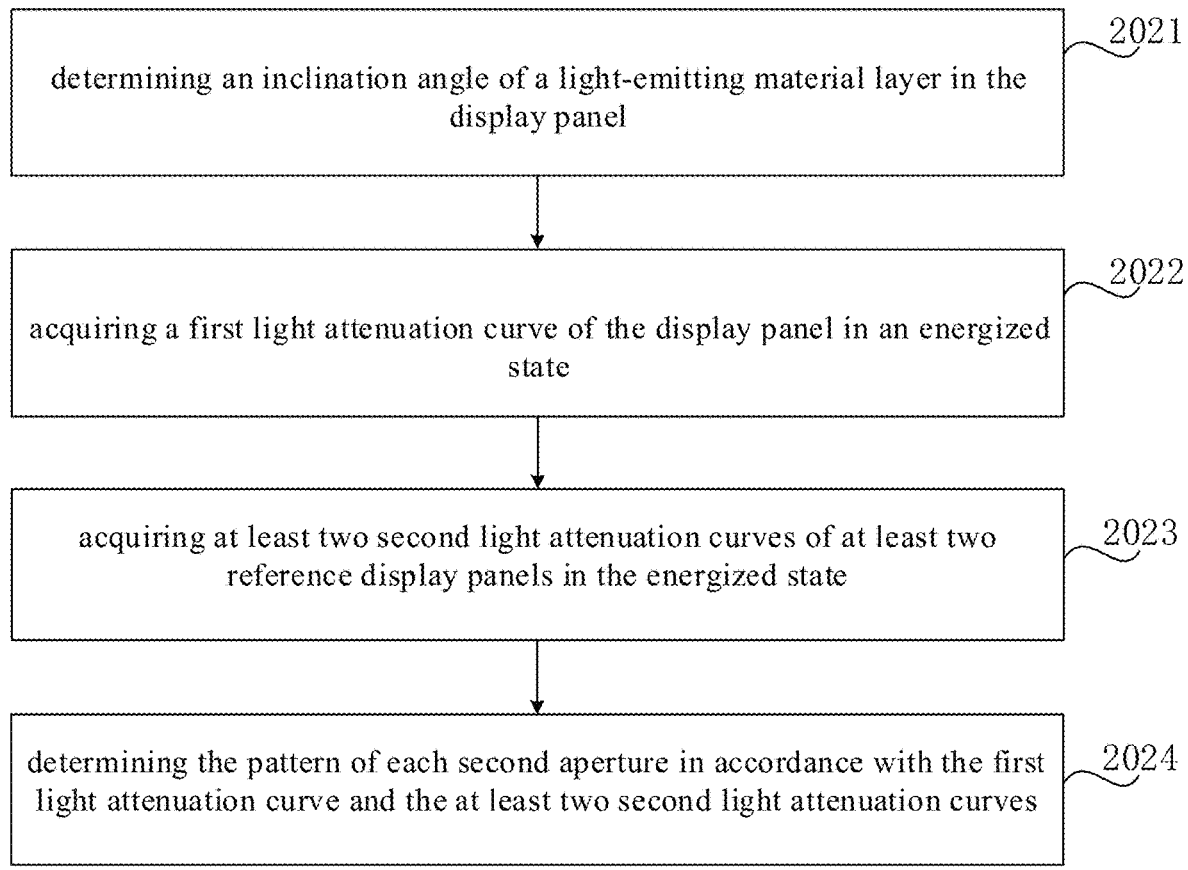
FIG. 13 is another flow chart of the method for manufacturing the display panel according to one embodiment of the present disclosure.

In some embodiments of the present disclosure, the pattern of the second aperture may be determined in advance. In addition, the patterning process may include applying a photoresist, exposing with a mask, developing, etching, and peeling off the photoresist. As shown in FIG. 13, the determining the patterns of the second apertures in the black matrix material layer may include the following steps.

Step 2021: determining an inclination angle of the light-emitting material layer in the display panel.

In this step, when the display panel is a display panel that has been manufactured, an FIB diagram of the display panel may be acquired through a scanning electron microscope, and then the inclination angle of the light-emitting material layer may be determined in accordance with the FIB diagram. When the display panel is a display panel that is being designed, the inclination angle of the light-emitting material layer in the display panel may be estimated in accordance with inclination angles of the light-emitting material layers in a plurality of existing display panels with a same back plane structure as the display panel.

Step 2022: acquiring a first light attenuation curve of the display panel in an energized state.

In this step, the first light attenuation curve of the display panel in the energized state may be acquired through a photometer. The light attenuation curve is used to represent normalized brightness values of the display panel at different viewing angles, and the normalized brightness value is used to represent a ratio of an actual brightness value at a positive or negative viewing angle to a largest brightness value of the light emitted by the light-emitting material layer. The display panel in the energized state may display a monochromatic image, e.g., a red image, a green image or a blue image. The photometer may be a PR-788 spectrophotometer with a wide dynamic range.

Step 2023: acquiring at least two second light attenuation curves of at least two reference display panels in the energized state.

In the embodiments of the present disclosure, for the at least two reference display panels, distances between edges of projections of first apertures and second apertures in a first direction and a direction opposite to the first direction may be different. Alight-emitting material layer and a black matrix in the reference display panel may be parallel to each other, i.e., the light-emitting material layer is parallel to a pixel definition layer. In the reference display panel, a projection of a first aperture corresponding to the light-emitting material layer onto the back plane may be located within a projection of a corresponding second aperture onto the back plane, and the protection of the first aperture and the projection of the second aperture may be identical patterns with their centers coinciding with each other. The first aperture may be an aperture in the pixel definition layer of the reference display panel and correspond to a subpixel, and the second aperture may be an aperture in the black matrix and correspond to the first aperture. In each reference display panel, a same distance may be provided between the edge of the projection of the first aperture and the edge of the projection of the corresponding second aperture in the first direction and the direction opposite to the first direction. FIG. 2 also shows a partially top view of the reference display panel.

In this step, the at least two second light attenuation curves of the reference display panels in the energized state may be acquired through a photometer, and an image displayed by the reference display panel in the energized state may be in a same color as an image displayed by the display panel in the energized state.

Step 2024: determining the pattern of each second aperture in accordance with the first light attenuation curve and the at least two second light attenuation curves.

In this step, the pattern of each second aperture may be determined as follows. Correspondences between viewing angle directions of the display panel and the first sub-aperture as well as the second sub-aperture may be determined in accordance with the first light attenuation curve. It should be appreciated that, in the embodiments of the present disclosure, an intensity of the light emitted by the light-emitting material layer in the first sub-aperture toward a light-exiting side of the display panel may be smaller than an intensity of the light emitted by the light-emitting material layer in the second sub-aperture toward the light-exiting side of the display panel. In the light attenuation curve, in the case of positive and negative viewing angles with a same absolute value, a normalized brightness value corresponding to the first sub-aperture may be smaller than a normalized brightness value corresponding to the second sub-aperture, and an attenuation speed of a light attenuation curve corresponding to the first sub-aperture may be greater than an attenuation speed of a light attenuation curve corresponding to the second sub-aperture.

The correspondences between the viewing angle directions of the first panel and the first sub-aperture as well as the second sub-aperture may be determined in accordance with the first light attenuation curve as follows. In the first light attenuation curve, a first normalized brightness value corresponding to a positive angle and a second normalization brightness value corresponding to a negative angle with a same absolute value as the positive angle may be determined. Then, a light attenuation sub-curve in a direction where a viewing angle corresponding to a smaller one of the first normalized brightness value and the second normalized brightness value is located may be determined as a light attenuation curve corresponding to the first sub-aperture, and a light attenuation sub-curve in a direction where a viewing angle corresponding to a larger one of the first normalized brightness value and the second normalized brightness value is located may be determined as a light attenuation curve corresponding to the second sub-aperture. The absolute value of any viewing angle may be greater than 0° and smaller than 90°. The viewing angle may be determined according to the practical need, and it will not be particularly defined herein. In a possible embodiment of the present disclosure, the viewing angle may be 30° or 45°.

Further, a first distance between edges of the projections of the first aperture and the second aperture onto the back plane in a reference display panel corresponding to a second light attenuation curve with a smallest attenuation speed in the at least two second light attenuation curves in the first direction may be acquired, and determined as a distance between the edges of the projections of the first sub-aperture and the second aperture onto the back plane in the display panel in a direction the pixel definition layer that the light-emitting material layer is inclined relative to. A second distance between edges of projections of the first aperture and the second aperture onto the back plane in a reference display panel corresponding to a second light attenuation curve with a largest attenuation speed in the at least two second light attenuation curves in a direction opposite to the first direction may be acquired, and determined as a distance between edges of the projections of the second sub-aperture and the second aperture onto the back plane in the display panel in a direction opposite to the direction of the pixel definition layer that the light-emitting material layer is inclined relative to. Then, the pattern of each second aperture may be determined.

The second light attenuation curve with the largest attenuation speed and the second light attenuation curve with the smallest attenuation speed may be determined in the at least two second light attenuation curves as follows. The at least two second light attenuation curves may be placed into a same coordinate system, and at least two normalized brightness values at any viewing angle may be determined. Then, a second light attenuation curve corresponding to a maximum normalized brightness value may be determined as the second light attenuation curve with the smallest attenuation speed, and a second light attenuation curve corresponding to a minimum normalized brightness value may be determined as the second light attenuation curve with the largest attenuation speed. This viewing angle may be the same as a viewing angle selected for determining the sub-curve with the smallest attenuation speed and the sub-curve with the largest attenuation speed in the first light attenuation curve.

It should be appreciated that, usually the display panel may include a plurality of subpixels in different colors in the embodiments of the present disclosure. For the light-emitting material layers for the plurality of subpixels in a same color, their inclination angles, the patterns of their projections onto the back plane and the areas of the projections may be the same, so the patterns of the second apertures corresponding to the light-emitting material layers for the subpixels in the same color may be determined once. For example, when the display panel includes a plurality of red subpixels, green subpixels and blue subpixels, the patterns of the second apertures corresponding to the light-emitting materials for the subpixels in three different colors may be determined in three times.

For example, when the display panel that has already been manufactured includes a plurality of red subpixels, green subpixels and blue subpixels, the patterns of the second apertures corresponding to the red subpixels may be determined in advance as follows.

Figure 14:
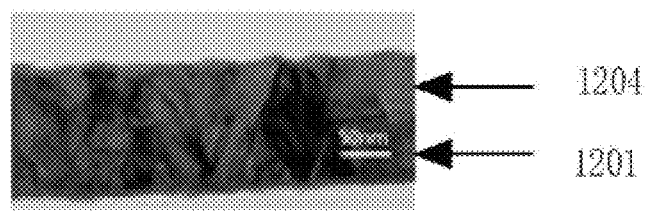
FIG. 14 is a Focused Ion Beam (FIB) diagram of the display panel according to one embodiment of the present disclosure.
Figure 15:
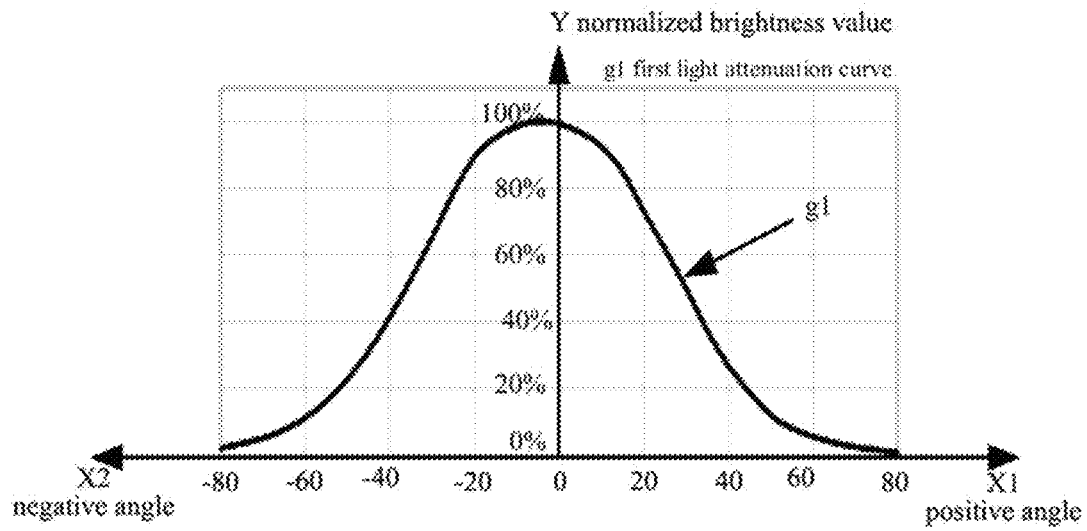
FIG. 15 is a curve diagram showing light attenuation for the display panel according to one embodiment of the present disclosure.
Figure 16:
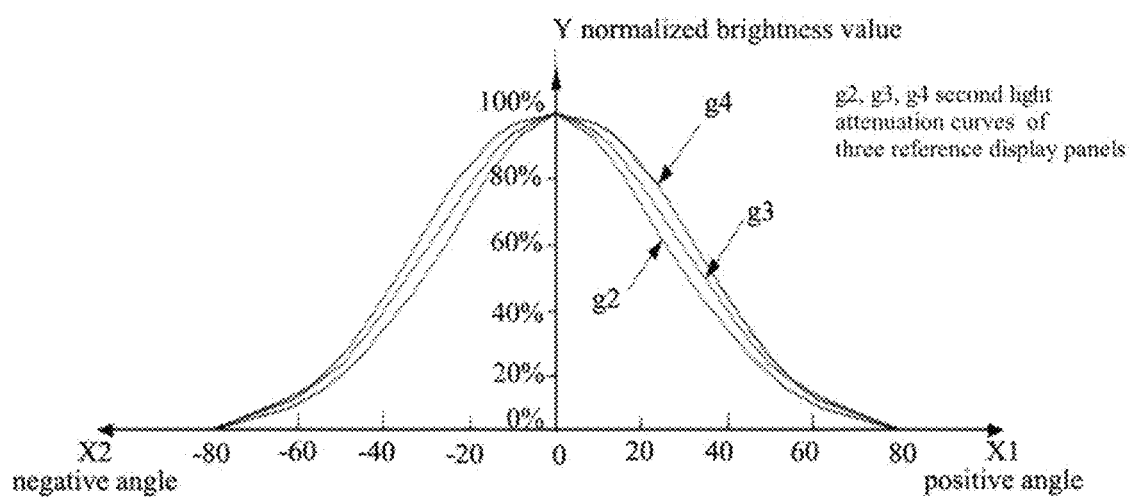
FIG. 16 is another curve diagram showing the light attenuation for the display panel according to one embodiment of the present disclosure.

At first, the FIB diagram of the display panel in FIG. 14 may be acquired through a scanning electron microscope, an inclination angle of the light-emitting material layer for the red subpixel may be determined as 4° in accordance with the FIB diagram, and the display panel may be energized to display a red image. Next, a first light attenuation curve g1 of the display panel may be acquired through a photometer as shown in FIG. 15, where an x-axis represents a viewing angle of the display panel, a direction x1 represents a positive angle, a direction x2 represents a negative angle, and a y-axis represents the normalized brightness value. A maximum brightness value of the light emitted by the light-emitting material layer for the red subpixel occurs at a viewing angle of −4°. Next, three second light attenuation curves of three reference display panels may be acquired through a photometer when a red image is displayed. FIG. 16 shows second light attenuation curves g2, g3 and g4 of the three reference display panels respectively. Distances between an edge of a projection of a first aperture and an edge of a projection of a second aperture in the first direction and in the direction opposite to the first direction in the reference display panel corresponding to g2 may each be 2 μm, distances between an edge of a projection of a first aperture and an edge of a projection of a second aperture in the first direction and in the direction opposite to the first direction in the reference display panel corresponding to g3 may each be 3 μm, and a distance between an edge of a projection of a first aperture and an edge of a projection of a second aperture in the first direction and in the direction opposite to the first direction in the reference display panel corresponding to g4 may each be 4 μm.

Further, in the first light attenuation curve as shown in FIG. 15, the selected viewing angle may be 30°, a normalized brightness value at a positive viewing angle of +30° may be 48%, and a normalized brightness value at a negative viewing angle of −30° may be 60%. It may be determined that, when the red image is displayed, the light attenuation speed is large in a positive viewing angle direction, and the positive viewing angle direction may correspond to the first sub-aperture; the light attenuation speed is small in a negative viewing angle direction, and the negative viewing angle direction may correspond to the second sub-aperture. Next, three normalized brightness values at the viewing angle of +30° may be determined as 52%, 60% and 66.5% in g2, g3 and g4, i.e., g4 may be the second light attenuation curve with the smallest attenuation speed, g2 may be the second light attenuation curve with the largest attenuation speed. Second distances between the edges of the projections of the first aperture and the second aperture onto the back plane in the reference display panel corresponding to g2 in the first direction and the direction opposite to the first direction may each be 2 μm, and this first distance may be determined as a distance between the edges of the projections of the second sub-aperture and the second aperture onto the back plane in the display panel in the direction of the pixel definition layer that the light-emitting material layer is inclined relative to. First distances between the edges of the projections of the first aperture and the second aperture onto the back plane in the reference display panel corresponding to g4 in the first direction and the direction opposite to the first direction may each be 4 μm, and this first distance may be determined as a distance between the edges of the projections of the first sub-aperture and the second aperture onto the back plane in the display panel in the direction opposite to the direction of the pixel definition layer that the light-emitting material layer is inclined relative to. Then, the pattern of the second aperture may be determined.

Step 204: forming a subpixel color film within each second aperture to form a color film layer.

In this step, the subpixel color film may be formed within the second aperture, and it may be in a same color as the light-emitting material layer of the subpixel corresponding to the second aperture. The subpixel color film may be made of a color resin, so as to ensure the flexibility of the display panel.

In order to protect the display panel, a protection film layer may be formed at a side of the color film layer away from the back plane. In this way, it is able to prevent oxygen and moisture from entering the display panel, and prevent the display panel from being damaged. The protection film layer may be made of silicon nitride, silicon oxide, or a mixture thereof.

It should be appreciated that, when the display panel has a touch function in the embodiments of the present disclosure, prior to Step 201, the method may further include forming a touch layer at a side of the display panel away from the back plane, and Step 201 may include forming the black matrix material layer at a side of the touch layer away from the back plane.

Figure 17:
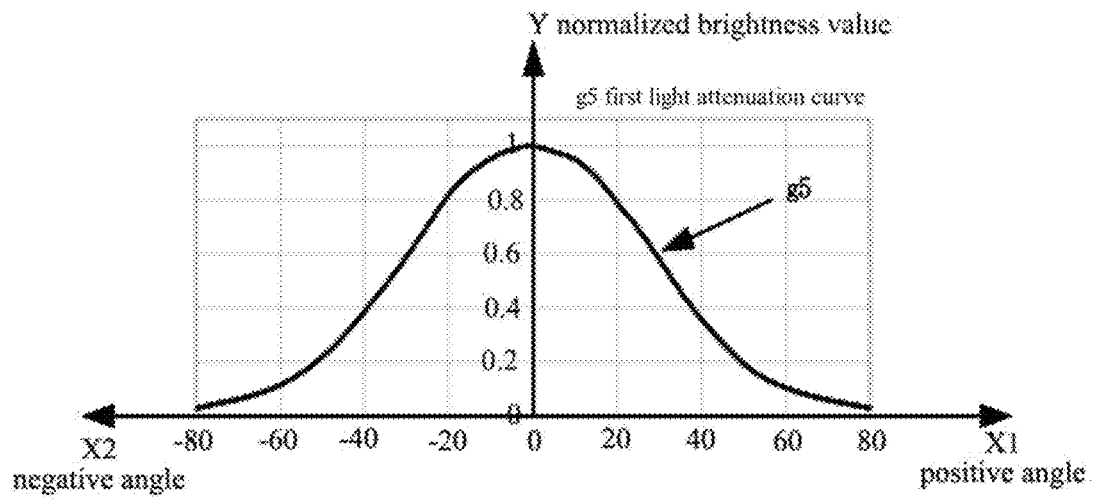
FIG. 17 is yet another curve diagram showing the light attenuation for the display panel according to one embodiment of the present disclosure.

For example, for the display panel including the light-emitting material layer of the red subpixel with the structure in FIG. 14, the color film layer may be formed on the thin film encapsulation layer through Steps 201 to 204, so as to acquire the display panel. For example, a first light attenuation curve g5 of the display panel when displaying a red image may be acquired through a photometer. As shown in FIG. 17, a normalized brightness value at a viewing angle of +30° may be 57%, and a normalized brightness value at a viewing angle of −30° may be 58%. It may be determined that, when the red image is displayed by the display panel, the light attenuation speed in the positive viewing angle direction may be substantially the same as that in the negative viewing angle direction. When the display panel includes the subpixels in the other colors, e.g., the blue subpixels and the green subpixels, the light-emitting material layers of these subpixels may not be inclined. When an image in mixed colors is displayed by the display panel, no color deviation may occur.

Figure 18:
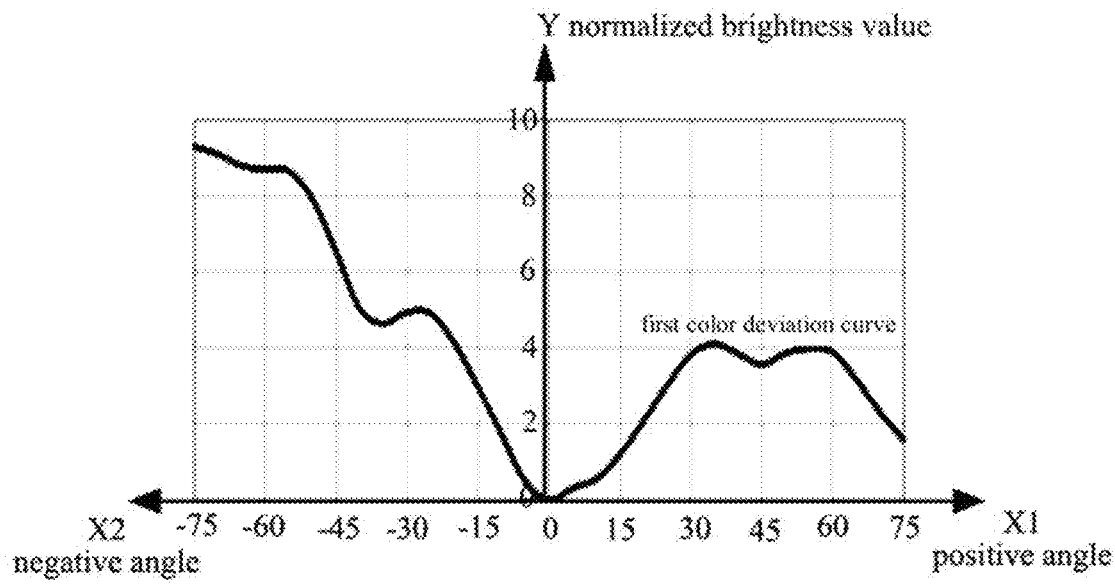
FIG. 18 is a curve diagram showing color deviation for the display panel according to one embodiment of the present disclosure.

FIG. 18 shows a first color deviation curve when a white image is displayed by the conventional display panel including the light-emitting material layer of the red subpixel with the structure in FIG. 14, where an x-axis represents the viewing angle, a direction x1 represents the positive viewing angle, a direction x2 represents the negative viewing angle, and a y-axis represents a color deviation value in unit of JNCD. As shown in FIG. 18, a color deviation value at a viewing angle of +30° is 3.8 JNCD, a color deviation value at a viewing angle of −30° is 4.9 JNCD, and a difference therebetween is greater than a color deviation threshold. The color deviation threshold may be determined according to the practical need, and it will not be particularly defined herein. For example, the color deviation threshold may be 1.

Figure 19:
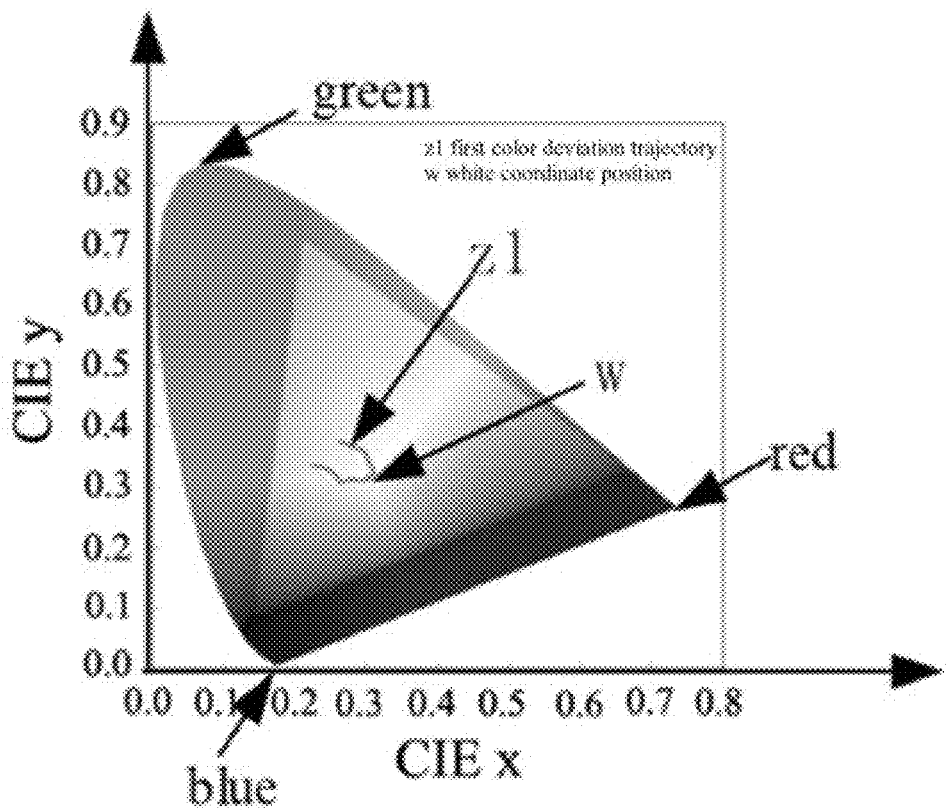
FIG. 19 is a diagram showing a color deviation trajectory of the display panel according to one embodiment of the present disclosure.

FIG. 19 shows a first color deviation trajectory z1 in a color gamut when a white image is displayed by the conventional display panel including the light-emitting material layer of the red subpixel with the structure in FIG. 14. With a white coordinate position w as a demarcation point, a part of the first color deviation trajectory z1 close to blue is a trajectory for the display panel at a negative viewing angle, and a part of the first color deviation trajectory z1 close to green is a trajectory for the display panel at a positive viewing angle. The two parts of trajectory are seriously asymmetric, so the color deviation may occur for the white light in the display panel.

Figure 20:
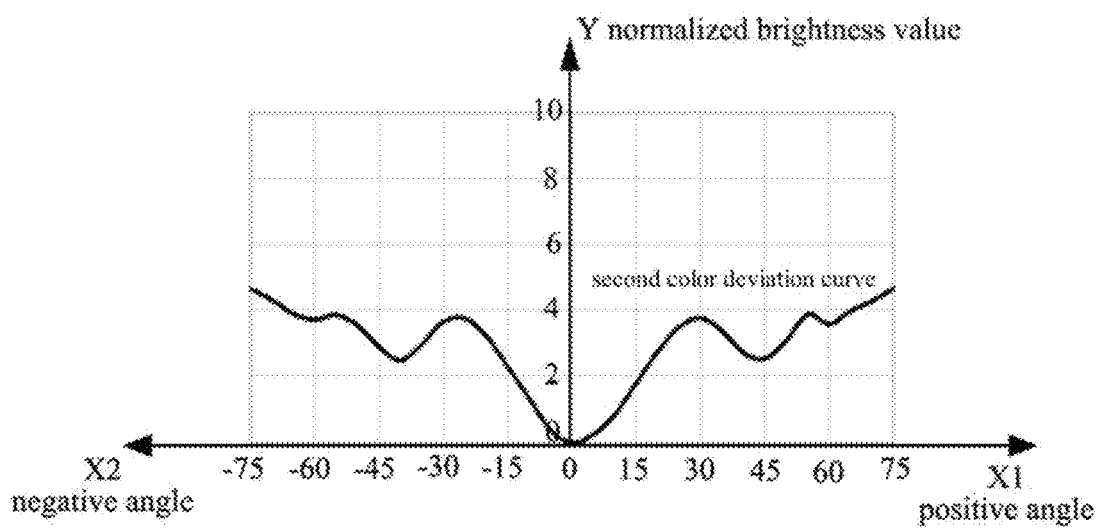
FIG. 20 is another curve diagram showing the color deviation for the display panel according to one embodiment of the present disclosure.

FIG. 20 shows a second color deviation curve when a white image is displayed by the display panel including the light-emitting material layer of the red subpixel with the structure in FIG. 14 according to one embodiment of the present disclosure, where a color deviation value at a viewing angle of +30° is 3.9 JNCD, a color deviation value at a viewing angle of −30° is 3.8 JNCD, and a difference therebetween is smaller than 1.

Figure 21:
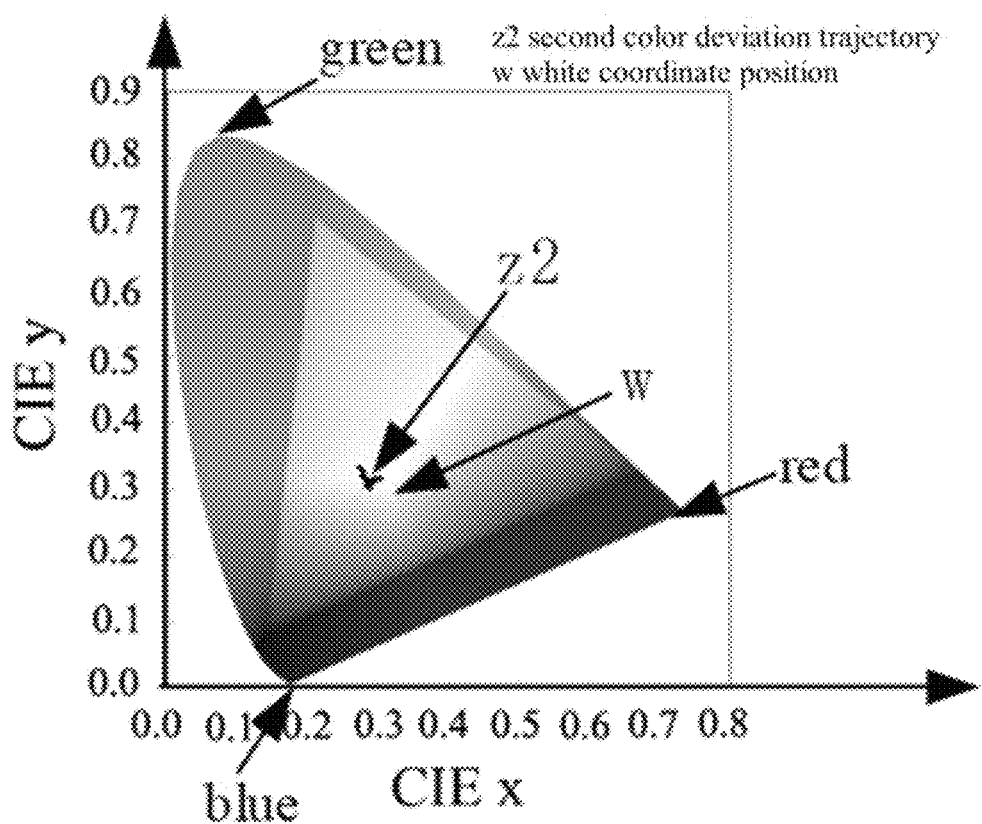
FIG. 21 is another diagram showing the color deviation trajectory of the display panel according to one embodiment of the present disclosure.

FIG. 21 shows a second color deviation trajectory z2 in a color gamut when a white image is displayed by the display panel including the light-emitting material layer of the red subpixel with the structure in FIG. 14 according to one embodiment of the present disclosure. As shown in FIG. 21, the second color deviation trajectory z2 is close to the white coordinate position w, so there is no obvious color deviation for the white light in the display panel.

In a word, according to the embodiments of the present disclosure, the method for manufacturing the display panel may include: forming the black matrix material layer at a side of the display panel away from the back plane; determining the patterns of the second apertures in the black matrix material layer; etching the black matrix material layer in accordance with the patterns of the second apertures, so as to form the second apertures corresponding to the first apertures respectively, the projection of each first aperture onto the back plane being located within the projection of the corresponding second aperture onto the back plane, the center of each second aperture being offset toward the peripheral point of the light-emitting material layer closest to the black matrix relative to the center of the corresponding first aperture; and forming the subpixel color film within each second aperture to form the color film layer. As a result, it is able for the light emitted by the light-emitting material layer to exhibit a same light attenuation level in the case of the positive and negative viewing angles with a same absolute value, thereby to prevent the occurrence of color deviation.

The present disclosure further provides in some embodiments a display device, e.g., a television, a mobile phone, a computer display or an electronic reader. A display panel of the display device may be the display panel or touch panel mentioned hereinabove, or a display panel or touch panel manufactured through the above-mentioned method.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising:
a back plane;
a plurality of subpixels arranged on the back plane and comprising a light-emitting material layer;
a pixel definition layer provided with first apertures corresponding to individual subpixels, each subpixel being located within a corresponding first aperture; and
a black matrix arranged at a side of the pixel definition layer away from the back plane and provided with second apertures corresponding to the each of the first apertures,
wherein a projection of each first aperture onto the back plane is located within a projection of a corresponding second aperture onto the back plane, a center of each second aperture is offset toward a peripheral point of the light-emitting material layer closest to the black matrix relative to a center of the corresponding first aperture, and the light-emitting material layer is in an inclined state relative to the pixel definition layer.

2. The display panel according to claim 1, wherein the a plurality of subpixels comprises subpixels of a first type and subpixels of a second type, a first light-emitting material layer of each subpixel of the first type is inclined relative to a first direction of the pixel definition layer, and a second light-emitting material layer of each subpixel of the second type is inclined relative to a second direction of the pixel definition layer.

3. The display panel according to claim 2, wherein the first direction is the same as the second direction.

4. The display panel according to claim 2, wherein the first direction is opposite to the second direction.

5. The display panel according to claim 3, wherein the subpixels of the first type comprise a blue subpixel, and the subpixels of the second type comprise a red subpixel.

6. The display panel according to claim 4, wherein the subpixels of the first type comprise a blue subpixel and the subpixels of the second type comprise a green subpixel, or the subpixels of the first type comprise a red subpixel and the subpixels of the second type comprise a green subpixel.

7. The display panel according to claim 2, wherein the subpixels of the first type comprise a blue subpixel and a red subpixel, and the subpixels of the second type comprise a green subpixel.

8. The display panel according to claim 1, wherein a first distance between a projection of the peripheral point of the light-emitting material layer closest to the black matrix onto the back plane and an edge of the projection of the second aperture onto the back plane in a direction of the pixel definition layer that the light-emitting material layer is inclined relative to is 3 μm to 5 μm.

9. The display panel according to claim 1, wherein a second distance between a projection of the peripheral point of the light-emitting material layer furthest from the black matrix onto the back plane and an edge of the projection of the second aperture onto the back plane in a direction opposite to a direction of the pixel definition layer that the light-emitting material layer is inclined relative to is 1 μm to 2 μm.

10. The display panel according to claim 1, wherein when an inclination angle of the light-emitting material layer increases, a distance of the center of the second aperture offset toward the peripheral point of the light-emitting material layer closest to the black matrix relative to the center of the first aperture increases.

11. The display panel according to claim 10, wherein the distance of the center of the second aperture offset toward the peripheral point of the light-emitting material layer closest to the black matrix relative to the center of the first aperture is 0.5 μm to 2 μm.

12. The display panel according to claim 1, wherein an aperture region of the first aperture between a center line of the first aperture passing through the center of the first aperture and a peripheral line passing through the peripheral point of the light-emitting material layer closest to the black matrix is determined as a first sub-aperture, a remaining aperture region of the first aperture is determined as a second sub-aperture, the center line and the peripheral line are perpendicular to the back plane, and a distance between an edge of a projection of the first sub-aperture onto the back plane and an edge of the projection of the second aperture onto the back plane in a direction of the pixel definition layer that the light-emitting material layer is inclined relative to is greater than a distance between an edge of a projection of the second sub-aperture onto the back plane and the edge of the projection of the second aperture onto the back plane in a direction opposite to the direction of the pixel definition layer that the light-emitting material layer is inclined relative to.

13. A display device, comprising the display panel according to claim 1.

14. A method for manufacturing the display panel according to claim 1, comprising:
    forming a black matrix material layer at a side of the display panel away from the back plane, the display panel comprising the back plane, a plurality of subpixels arranged on the back plane and comprising the light-emitting material layer, and the pixel definition layer provided with first apertures corresponding to the individual subpixels, each subpixel being located within the corresponding first aperture;
    determining patterns of second apertures in the black matrix material layer;
    etching the black matrix material layer in accordance with the patterns of the second apertures so as to form the second apertures corresponding to the each of the first apertures, the projection of each first aperture onto the back plane being located within the projection of the corresponding second aperture onto the back plane, the center of each second aperture being offset toward the peripheral point of the light-emitting material layer closest to the black matrix relative to the center of the corresponding first aperture, and the light-emitting material layer being in the inclined state relative to the pixel definition layer; and
    forming a subpixel color film within each second aperture to form a color film layer.

15. The method according to claim 14, wherein the determining the patterns of the second apertures in the black matrix material layer comprises:

determining the inclination angle of the light-emitting material layer in the display panel;
acquiring a first light attenuation curve of the display panel in an energized state;
acquiring at least two second light attenuation curves of at least two reference display panels in the energized state, each second light attenuation curve being a symmetric curve, the light-emitting material layer in each reference display panel is parallel to the pixel definition layer, distances between edges of projections of first apertures and second apertures onto the back plane in the at least two reference display panels in the first direction and a direction opposite to the first direction being different from each other; and
determining the patterns of the second apertures in accordance with the first light attenuation curve and the at least two second light attenuation curves.

16. The method according to claim 15, wherein the determining the patterns of the second apertures in accordance with the first light attenuation curve and the at least two second light attenuation curves comprises:
    determining correspondences between viewing angel directions of the display panel and the first sub-aperture as well as the second sub-aperture in accordance with the first light attenuation curve, the first sub-aperture being an aperture region of the first aperture between a center line passing through the center of the first aperture and a peripheral line passing through the peripheral point of the light-emitting material layer closest to the black matrix, the second sub-aperture being a region of the first aperture other than the first sub-aperture;
    acquiring a first distance between edges of projections of the first aperture and the second aperture onto the back plane in a reference display panel corresponding to a second light attenuation curve with a smallest attenuation speed in the at least two second light attenuation curves in the first direction, and determining the first distance as a distance between edges of projections of the first sub-aperture and the second aperture onto the back plane in the display panel in the direction of the pixel definition layer that the light-emitting material layer is inclined relative to;
    acquiring a second distance between edges of projections of the first aperture and the second aperture onto the back plane in a reference display panel corresponding to a second light attenuation curve with a largest attenuation speed in the at least two second light attenuation curves in the direction opposite to the first direction, and determining the second distance as a distance between edges of projections of the second sub-aperture and the second aperture onto the back plane in the display panel in the direction opposite to the direction of the pixel definition layer that the light-emitting material layer is inclined relative to; and
    determining the patterns of the second apertures.

17. The method according to claim 16, wherein the determining the correspondences between the viewing angle directions of the display panel and the first sub-aperture as well as the second sub-aperture in accordance with the first light attenuation curve comprises determining a first normalized brightness value corresponding to a positive viewing angle and a second normalized brightness value corresponding to a negative viewing angle with a same absolute value as the positive viewing angle in the first light attenuation curve, determining a light attenuation sub-curve in a direction where a viewing angle corresponding to a smaller one of the first normalized brightness value and the second normalized brightness value is located as the light attenuation curve corresponding to the first sub-aperture, and determining a light attenuation sub-curve in a direction where a viewing angle corresponding to a larger one of the first normalized brightness value and the second normalized brightness value is located as the light attenuation curve corresponding to the second sub-aperture, wherein an absolute value of each of the positive viewing angle or the negative viewing angle is greater than 0° and smaller than 90°.

* * * * *